United States Patent

[11] 3,629,668

[72] Inventor Ashok R. Hingorany
North Attleboro, Mass.
[21] Appl. No. 886,713
[22] Filed Dec. 19, 1969
[45] Patented Dec. 21, 1971
[73] Assignee Texas Instruments Incorporated
Dallas, Tex.

[54] SEMICONDUCTOR DEVICE PACKAGE HAVING IMPROVED COMPATIBILITY PROPERTIES
3 Claims, 6 Drawing Figs.

[52] U.S. Cl. .......... 317/234 R, 317/235 R, 317/234 N, 317/234 L, 317/234 E, 174/52 PE, 174/DIG. 3
[51] Int. Cl. .......... H01l 3/00, H01l 5/00
[50] Field of Search .......... 317/234 (5.4); 29/193, 193.5; 174/52 PE, 52 S, DIG. 3, DIG. 5

[56] References Cited

UNITED STATES PATENTS

| | | | |
|---|---|---|---|
| 3,374,537 | 3/1968 | Doelp, Jr. | 29/627 |
| 3,509,430 | 4/1970 | Mroz | 317/234 |
| 3,404,319 | 10/1968 | Tsuji et al. | 317/234 |
| 3,484,533 | 12/1969 | Kauffman | 174/52 |

*Primary Examiner*—John W. Huckert
*Assistant Examiner*—B. Estrin
*Attorneys*—Harold Levine, Edward J. Connors, Jr., John A. Haug, James P. McAndrews and Gerald B. Epstein

ABSTRACT: A semiconductor device package is provided including a lead frame formed of a first preselected conductive material which is thermally and/or chemically compatible with a support carrier material. The lead frame includes a plurality of exposed leads adapted to be interconnected in an electronic system and a plurality of associated terminals which are integrally joined to the leads by shoulder members and are adapted to be interconnected with a semiconductor device. A semiconductor bonding pad and supporting tie bars extending from opposed ends thereof is formed of a second preselected material which is thermally and/or chemically compatible with the material from which the semiconductor device is formed, and is arranged in spaced relationship with the terminals for supporting the semiconductor device. The tie bars are attached to temporary side members on the lead frame during fabrication of the unit in order to temporarily support the bonding pad in position prior to removal of the supporting side members and the completion of the encapsulation of the package in the support carrier.

INVENTOR
ASHOK R. HINGORANY
BY
Gerald B Epstein ATTORNEY

INVENTOR
ASHOK R. HINGORANY
BY

Gerald B. Epstein ATTORNEY

SEMICONDUCTOR DEVICE PACKAGE HAVING IMPROVED COMPATIBILITY PROPERTIES

The present invention relates generally to semiconductor device packaging and more particularly to an improved semiconductor device package and method of fabrication.

In recent years, numerous techniques have been developed for packaging semiconductor devices, such as integrated circuits, having a plurality of circuit elements formed at a surface of a wafer of semiconductor material such as silicon. Generally, such techniques have involved the provision of a suitable lead frame formed of a metallic material, including a plurality of leads which are to be interconnected in an electronic system and a plurality of terminals which are to be interconnected with the circuit elements of the integrated circuit. The lead frame structure also generally includes an integral portion for supporting the integrated circuit. For example, the lead frame in many instances includes a semiconductor bonding pad which is formed as an integral portion of the lead frame and is arranged adjacent the terminals for supporting the semiconductor device in a position which facilitates the formation of interconnections between the circuit elements of the integrated circuit and the terminals. Other arrangements are also available in which regions of the semiconductor device are directly supported by the terminals of the lead frame and are also electrically interconnected with the terminals. Such units may be then encapsulated in a nonconductive material. In recent years, it has become increasingly prevalent to encapsulate such units in a support carrier of a thermosetting plastic or epoxy material in view of the economy and durability of such a configuration. Similarly, units of this type are also available in which other materials, such as various ceramic materials, are utilized, in forming the support carrier.

Regardless of the specific configuration utilized, problems have arisen due to the different thermal and chemical characteristics of the lead frame material and the semiconductor device both of which are encased or encapsulated by the support carrier material. Such problems may be particularly significant, when the completed unit is to be exposed to a relatively large range of temperatures, for example, during temperature cycling tests to ascertain the reliability and performance of the unit under varying temperature conditions, as well as during the occurrence of such varying temperature conditions during the subsequent operational use of the unit. Typically, units may be built in which the entire lead frame including the semiconductor bonding pad, which supports the integrated circuit, is formed of a preselected metallic alloy which has thermal and chemical properties compatible with the integrated circuit which is to be supported on the bonding pad. Such a selection is necessary to avoid adverse reactions between the bonding pad and the integrated circuit during exposure to adverse temperature conditions. However, the lead frame material may be quite incompatible with the support carrier material so that exposure to such temperature levels may cause adverse reactions between the support carrier and the lead frame material leading to package leakage, fractures, etc., and to possible consequent degradation of the electrical properties of the unit as a result of such adverse affects.

Accordingly, it is an object of the present invention to provide an improved semiconductor device package which avoids adverse affects of thermal incompatibility.

It is another object of the present invention to provide an improved semiconductor device package in which thermal and chemical compatibility between the lead frame and the encapsulation material is achieved.

It is a further object of the present invention to provide an improved semiconductor device package in which thermal and chemical compatibility is achieved between the semiconductor device and the support therefor, as well as between the lead frame and the encapsulation material.

It is still a further object of the present invention to provide an improved semiconductor device package in which thermal and chemical compatibility between the constituent components is effected and which is economical to manufacture and durable in use.

Various additional objects and advantages will become readily apparent from the following detailed description and accompanying drawings wherein.

Figures 1, 2:
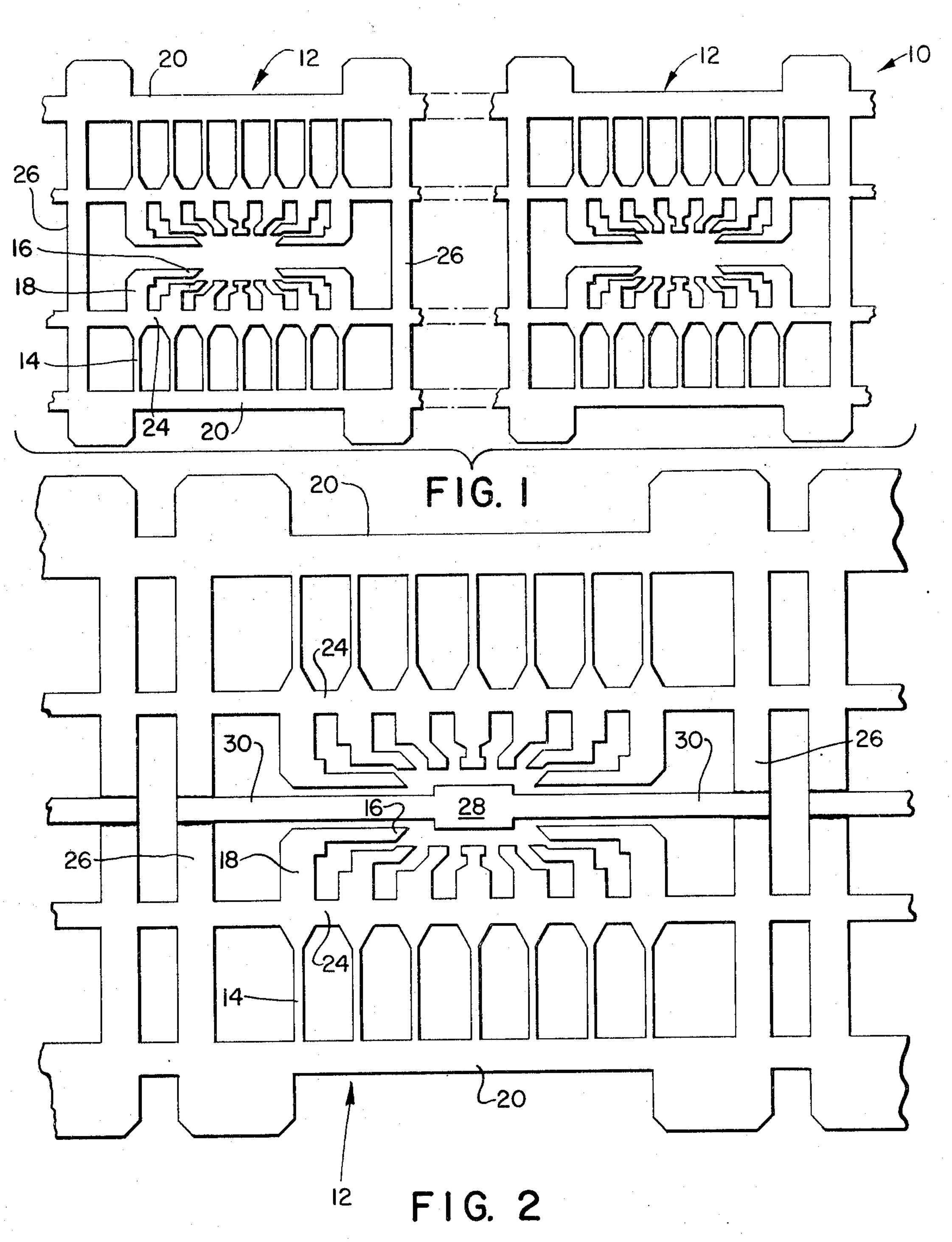
FIG. 1 is a plan view of a portion of a strip of conductive material which has been stamped to form a plurality of individual lead frame units.
FIG. 2 is a plan view similar to FIG. 1 subsequent to the completion of a further processing operation.

Referring now to the drawings and particularly to FIG. 1, there is shown an endless strip 10 of a preselected conductive material which has been suitably processed by the application of a stamping operation, an etching operation, etc., in order to form a plurality of lead frame units 12 which are successively interconnected but adapted to be separated at a subsequent stage in the operation to form individual lead frame units. The successive lead frame units 12 are preferably formed from a continuous strip of the preselected conductive material and are individually spaced from each other to facilitate subsequent separation of the units. Each of the lead frame units includes a plurality of exposed aligned leads 14, which extend outwardly from opposed edges thereof, and a plurality of associated terminals 16 which are preferably coplanar and extend inwardly of the lead frame structure toward a common center but terminate in generally confronting spaced relationship with each other. In addition, each of the leads is integrally joined to its associated terminal by a shoulder member 18. As shown, each of the lead frame units 12 further includes a pair of opposed longitudinally extending web members 20 extending along the outer edges of the leads 14 to interconnect the leads and brace the structure and the leads at this stage in manufacture. In addition, the respective sets of shoulder members 18 are similarly each interconnected by longitudinally extending rib members 24 arranged interconnecting adjacent shoulder members, as shown. Further mechanical support is provided for each of the lead frame units by the provision of a side member 26 at each side of each individual lead frame unit. The side members 26 interconnect the outer ends of each of the respective webs 20 and ribs 24 to furnish additional rigidity to the structure at this stage of fabrication and also serve to define the outer sides of the separated units. The side members 26 further serve a significant function in that they are utilized for temporarily mechanically supporting the means utilized for supporting the semiconductor device in position, such means being absent in the structure illustrated in FIG. 1.

Referring to FIG. 2, a lead frame unit 12 is illustrated greatly enlarged which is identical to those illustrated in FIG. 1, but in addition, includes the provision of a bonding pad 28. The bonding pad comprises a second preselected material different from the first preselected material from which the lead frame 12 is fabricated. As shown, the bonding pad 28 is secured in position in spaced relationship from the terminals 16, and is maintained rigidly in this position by the provision of a pair of tie bars 30, which are integrally joined to the semiconductor bonding pad. The tie bars are attached to the side members 26 of the lead frame structure by spot welding, crimping, etc., so as to maintain the semiconductor bonding pad securely in position at this state of fabrication. By virtue of forming the semiconductor bonding pad 28 of a material which is different from that of the lead frame material, it is possible to utilize materials, which are selected for their compatibility with the semiconductor device which is to be supported thereon independently of the properties desired in the remainder of the lead frame. In this regard, as will be more fully explained hereinafter, the lead frame material may be selected to include properties such as its coefficient of thermal expansion, chemical reactivity, etc., which are compatible with the material which is to be subsequently utilized in encasing or encapsulating the unit, while the semiconductor bonding pad material may be selected to include properties, such as its thermal coefficient of expansion, chemical reactivity, etc., which are particularly compatible with the material comprising the semiconductor device which it is to support and with which it may be maintained in engagement. The necessity for such differences in properties between the lead frame 12 and the semiconductor bonding pad 28 will become more readily apparent from an inspection of FIG. 3 which illustrates the unit of FIG. 2 at a subsequent stage of manufacture in which it is partially encased or encapsulated in a support carrier 32 comprising a preselected nonconductive material which may be selected for its compatibility with the lead frame material as well as for its durability, economy, etc.

Figure 3:
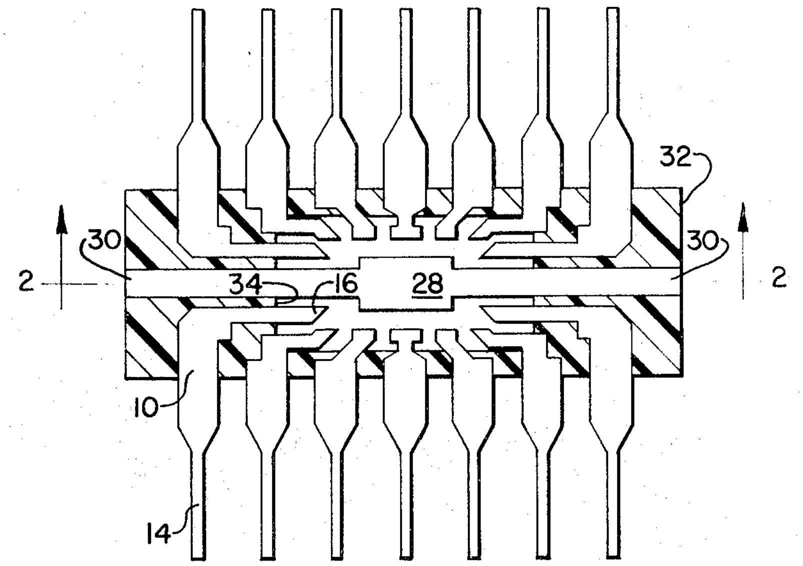
FIG. 3 is a plan view of an individual unit illustrated in FIG. 2 subsequent to the completion of a further processing step.

In the unit illustrated in FIG. 3, the various supporting members such as the side members 26, the shoulder connecting ribs 24, the web 20, etc., have been removed since the unit is self-supporting as a result of the provision of the support carrier material 32 which partially encases the shoulder members 18, the terminals 16 and a portion of the tie bars 30. In this regard, it may be noted that these various supporting members may be removed just prior to the encapsulation procedure by arranging the unit in a suitable supporting jig, and severing or removing these various supporting members just prior to effecting the encapsulation procedure. As part of the procedure, involving the removal of these aforementioned supporting members, the side members 26 to which the ends of the tie bars 30 are attached, are similarly severed or removed since the mechanical support for the semiconductor bonding pad provided by the side members is no longer required once the tie bars are embedded within the support carrier material. It should be also noted in this regard, that, if desired, a semiconductor device such as an integrated circuit may be arranged on the bonding pad and interconnected with the various terminals in the manner to be described hereinafter prior to the removal of the various supporting members and the disposition of the support carrier, although generally it is more convenient to initially remove these various supporting members and at least partially encase the lead frame within a suitable supporting material prior to the disposition and interconnection of the semiconductor device, as will be subsequently described.

Figure 4:
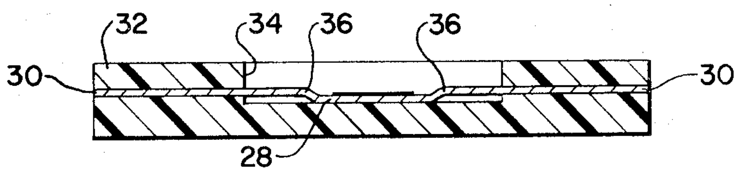
FIG. 4 is a vertical sectional view of the device illustrated in FIG. 3 taken along line 4—4.

Referring now to FIG. 4, it may be seen that the support carrier 32 also includes a generally centrally located opening or cavity 34 which extends from one surface of the support carrier and exposes the semiconductor bonding pad 28 as well as the various terminals 16. The provision of the cavity 34 facilitates the disposition of a semiconductor device, such as an integrated circuit, on the bonding pad and also facilitates the provision of electrical connections between selected terminals and various regions of the semiconductor device. In addition, it may be seen from FIG. 4, that the tie bars 30, which are embedded in the support carrier material 32 and support the semiconductor bonding pad 28, each includes a curved shoulder portion 36 so as to permit orientation of the semiconductor bonding pad in a plane spaced from the plane defined by the coplanar terminals 16. In the illustrated embodiment, the shoulder portions 36 curve downwardly from the tie bars 30 so as to position the semiconductor bonding pad 28 in a plane spaced slightly vertically below the plane defined by the terminals 16. As a result, a semiconductor device which may comprise a thin wafer of silicon semiconductor material, or the like, when disposed on the semiconductor bonding pad, as explained hereinafter, will have its exposed surface approximately at the same level as the plane of the terminals so as to expedite the formation of interconnections between various regions of the semiconductor device and the terminals. Furthermore, the semiconductor bonding pad 28 is supported at the base of the cavity 34, as shown, in FIG. 4 so that additional support is provided for the semiconductor bonding pad, while its exposed surface is free to support the semiconductor device.

Figure 5:
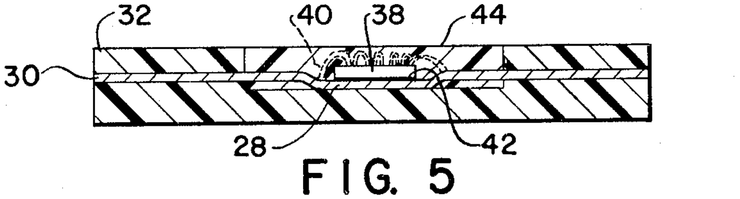
FIG. 5 is a view similar to FIG. 4 illustrating the unit of FIG. 4 in a completed stage of fabrication.

Referring now to FIG. 5, the unit shown in FIG. 4 is illustrated at a subsequent stage of fabrication at which it is essentially in completed form. The unit includes a semiconductor device 38, such as an integrated circuit, having a plurality of circuit elements at a surface thereof which is disposed in position on the exposed surface of the bonding pad 28. In addition, a plurality of whisker wire leads 40 of gold, silver, aluminum etc., are provided interconnecting the circuit elements of the integrated circuit 38 with selected terminals. These wire leads 40 are preferably ultrasonically bonded in position, although other forms of attachment may be used if desired. In order to facilitate attachment of the integrated circuit 38 to the surface of the semiconductor bonding pad, in certain instances, it may be desirable to plate a thin film 42 of a material such as gold, silver, aluminum, etc., on the exposed surface of the bonding pad and to secure the integrated circuit to the surface of the bonding pad by alloying the semiconductor material with the layer 42. Similarly, a metallic film of this type may be provided on the exposed surfaces of the terminals so as to facilitate the attachment of the wire leads 40 to the respective terminals. This metallic film may be initially provided on the strip of material 12 at a preliminary stage of fabrication just prior to or subsequent to the stamping or etching step which forms the lead frame units by applying a stripe of this film of metallic material on the requisite surfaces. Alternatively, the in3egrated circuit may be attached to the bonding pad utilizing a conductive cement or the like. In any event, in accordance with an important feature of the present invention, the integrated circuit 38, which is preferably formed of silicon semiconductor material is in engagement with the bonding pad, formed of a preselected material which is thermally and chemically compatible with the silicon semiconductor material, while the lead frame is formed of a different preselected conductive material, which is chemically and thermally compatible with the support carrier material.

In order to complete the unit, a sealant plug 44 is sealingly disposed within the cavity 34 in order to seal the cavity against the environment and thereby provide additional protection for the integrated circuit 38. The sealant plug may be preformed or molded in position and preferably comprises the same material as the support carrier material.

Figure 6:
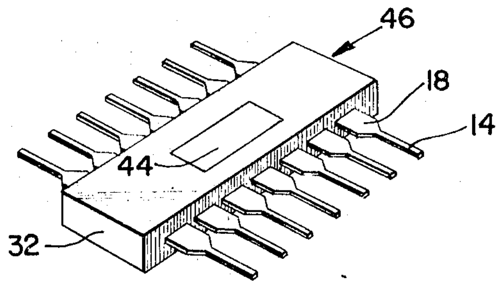
FIG. 6 is a perspective view of a completed unit in accordance with the present invention.

Referring now to FIG. 6, a perspective view of a completed unit 46, such as that shown in FIG. 5, is illustrated. It may be noted that the unit shown in FIG. 4 is in the so-called flat-pack configuration in which the exposed leads 14 extend directly outwardly from opposed edges of the support carrier 32 terminating in aligned spaced relationship as shown. This structure may be readily modified to form the so-called dual-in-line configuration by merely applying a suitable bending pressure to effect bending of the leads at the shoulder portions 18, such that the leads extend generally perpendicularly to the shoulder members.

In forming a unit in accordance with the present invention the first preselected conductive material from which the lead frame is formed preferably comprises a metallic alloy such as a cupronickel alloy including between approximately 10 and 30 percent nickel and between 90 and 70 percent copper. Such an alloy is relatively corrosion resistant and readily solderable so as to facilitate subsequent interconnections between various portions of the lead frame, i.e., the leads, the terminals, etc., and other electronic devices. The support carrier material 32 is formed of a nonconductive material such as a thermosetting plastic epoxy material which is readily molded using conventional transfer molding or cast molding techniques. Such a material generally has a coefficient of thermal expansion which is quite similar to the cupronickel alloy previously described and also is chemically compatible with this metallic alloy. Thus, a high degree of compatibility is achieved between the lead frame material and the support carrier material essentially without regard to the properties of the integrated circuit semiconductor device which may have substantially different thermal and/or chemical properties. In addition, in certain instances, it may be desirable to form the support carrier of a suitable ceramic material and if such a ceramic material is utilized, which has substantially different thermal and/or chemical properties from the previously described lead frame material, a different lead frame material may be readily selected.

The second preselected material from which the semiconductor bonding pad and tie bars are fabricated is selected primarily with regard to its thermal and/or chemical properties as compared with those of the semiconductor material, which is to be secured in engagement therewith. In a preferred embodiment of the present invention, a silicon semiconductor material is utilized for forming the integrated circuit 38 and the second preselected material may comprise a metallic alloy such as that commonly sold under the trademark Kovar which includes between approximately 23 to 30 percent nickel, between 30 and 17 percent cobalt, between 0.6 and 0.8 percent manganese, and the balance iron. Another example of a suitable material for use in this regard comprises the metallic alloy commonly sold under the trademark Invar, which includes approximately 36 percent nickel, less than 1 percent manganese, silicon, and carbon, and the balance iron. Each of these materials has thermal and chemical properties which are compatible with silicon semiconductor material and are thus quite advantageous for use in forming the semiconductor bonding pad and tie bars. In addition, if desired, the semiconductor bonding pad may be formed of a suitable clad material such as Invar or Kovar clad on opposed surfaces with copper in order to improve the thermal conduction properties. Such a configuration may also of course include a silver, gold, or aluminum film or stripe on the exposed surface which is to receive the semiconductor device to facilitate the attachment of the semiconductor device to the bonding pad.

Thus, a semiconductor device package has been illustrated and described in which the lead frame material and the semiconductor bonding pad material are independently selected in order to achieve the desired properties which each can separately provide in order to attain thermal and/or chemical compatibility between the lead frame and the encapsulation material, while similarly attaining thermal and/or chemical compatibility between the semiconductor bonding pad material and the semiconductor device. Thus, it is possible to avoid the necessity for comprising the properties of the lead frame and semiconductor bonding pad, when only a single material is utilized for both elements which material may be somewhat incompatible with either the encapsulation material or the semiconductor device material. In addition, a method for fabricating such a unit has been described in which the separately provided semiconductor bonding pad is supported by associated tie bars, which are initially temporarily attached to side members of the lead frame structure and then subsequently severed from the side members just prior to or as a part of the encapsulation procedure, which furnishes alternate support for the semiconductor bonding pad structure.

Various changes and modifications in the above-described invention will be readily apparent to one skilled in the art and such changes and modifications are deemed to be within the spirit and scope of the present invention as set forth in the appended claims.

What is claimed is:

1. A semiconductor device package comprising a. a lead frame of a first preselected conductive material having predetermined chemical and thermal properties for compatibility with a predetermined nonconductive material adapted at least partially to encapsulate said lead frame, said lead frame including a plurality of exposed leads extending outwardly from opposed sides of said lead frame and being adapted to be interconnected to an electronic system, a plurality of terminals extending inwardly toward a common central location defined by said lead frame and being adapted to be electrically connected to a semiconductor device, and a plurality of shoulder members integrally joining respective associated leads and terminals.

b. a semiconductor bonding pad of a second preselected material being chemically and thermally compatible with the semiconductor material comprising the semiconductor device, said semiconductor bonding pad being arranged at said central location in spaced relationship from said terminals and being adapted to support the semiconductor device.

c. means for supporting said semiconductor bonding pad including a pair of integral tie bars extending from opposed ends of said semiconductor bonding pad and being maintained rigidly in position.

d. a support carrier of said predetermined nonconductive material being arranged in encapsulating relationship with said lead frame but exposing said leads, said support carrier including a selectively sealable cavity exposing a surface of said bonding pad and a preselected portion of said terminals and comprising a plastic thermosetting epoxy.

e. said first preselected conductive material comprising a solderable, corrosion resistant material having a coefficient of thermal expansion which is compatible with that of said thermosetting epoxy and comprising a metallic alloy including approximately, between 10 and 30 percent nickel and between 90 and 70 percent copper, f. said tie bar being also of said second preselected material and extend outwardly from opposed ends of said semiconductor bonding pad in mutually opposite directions, and g. said second preselected material having a coefficient of thermal expansion which is compatible with that of silicon semiconductor material and comprising a metallic alloy including approximately either 36 percent nickel, less than 1 percent of manganese, silicon, carbon, and the balance iron, or between 23 and 30 percent nickel, 30 and 17 percent cobalt, between 0.6 and 0.8 percent manganese and the balance iron.

2. A semiconductor device package in accordance with claim 1 wherein a metallic film selected from the class consisting of gold, silver, and aluminum, is disposed on the exposed surface of said bonding pad and a semiconductor device comprising a wafer of silicon is bonded to said film, one surface of said wafer being exposed within said cavity.

3. A semiconductor device package in accordance with claim 2 wherein said semiconductor device comprises an integrated circuit having a plurality of circuit elements at said one exposed surface, said integrated circuit being alloyed to said metallic film, a plurality of conductors are bonded between selected circuit elements and said terminals, and a sealant plug is sealingly disposed within said cavity.

* * * * *